US006988535B2

(12) United States Patent
Upadhya et al.

(10) Patent No.: US 6,988,535 B2

(45) Date of Patent: Jan. 24, 2006

(54) CHANNELED FLAT PLATE FIN HEAT EXCHANGE SYSTEM, DEVICE AND METHOD

(75) Inventors: Girish Upadhya, Mountain View, CA (US); Richard Herms, Cupertino, CA (US); Peng Zhou, Albany, CA (US); Kenneth Goodson, Belmont, CA (US)

(73) Assignee: Cooligy, Inc., Mountain View, CA (US)

( * ) Notice: Subject to any disclaimer, the term of this patent is extended or adjusted under 35 U.S.C. 154(b) by 0 days.

(21) Appl. No.: 10/699,505

(22) Filed: Oct. 30, 2003

(65) Prior Publication Data

US 2004/0188064 A1 Sep. 30, 2004

Related U.S. Application Data

(60) Provisional application No. 60/423,009, filed on Nov. 1, 2002, provisional application No. 60/442,383, filed on Jan. 24, 2003, and provisional application No. 60/455,729, filed on Mar. 17, 2003.

(51) Int. Cl.
*F28F 7/00* (2006.01)

(52) U.S. Cl. ................................ 165/80.4; 165/104.33; 165/104.21; 361/699; 174/15.1; 257/715

(58) Field of Classification Search ................ 165/80.3, 165/80.4, 185, 104.21, 104.33; 361/697, 361/699, 700; 257/714–716; 174/15.2

See application file for complete search history.

(56) References Cited

U.S. PATENT DOCUMENTS

| | | | |
|---|---|---|---|
| ,596,062 A | 12/1897 | Firey | |
| 2,039,593 A * | 5/1936 | Hubbuch et al. | 165/170 |
| 2,273,505 A | 2/1942 | Florian | |
| 3,361,195 A | 1/1968 | Meyerhoff et al. | |
| 3,771,219 A | 11/1973 | Tuzi et al. | |
| 3,817,321 A | 6/1974 | von Cube et al. | |
| 4,203,448 A | 5/1980 | Keller, Jr. | |
| 4,211,208 A | 7/1980 | Lindner | |
| 4,235,285 A | 11/1980 | Johnson et al. | |
| 4,345,267 A | 8/1982 | Corman et al. | |

(Continued)

FOREIGN PATENT DOCUMENTS

| | | |
|---|---|---|
| JP | 1-256775 | 10/1989 |
| JP | 10-99592 | 4/1998 |
| JP | 2001-326311 | 11/2001 |

OTHER PUBLICATIONS

Yongendra Joshi, "Heat out of small packages", Dec. 2001, Mechanical Engineer, pp. 56–58.

Snezana Konechi et al., "Convection Cooling of Microelectronic Chips", 1992, InterSociety Conference on Thermal Phenomena, pp. 138–144.

(Continued)

*Primary Examiner*—Terrell McKinnon
(74) *Attorney, Agent, or Firm*—Haverstock & Owens LLP

(57) ABSTRACT

A device, method, and system for a fluid cooled channeled heat exchange device is disclosed. The fluid cooled channeled heat exchange device utilizes fluid circulated through a channel heat exchanger for high heat dissipation and transfer area per unit volume. The device comprises a highly thermally conductive material, preferably with less than 200 W/m-K. The preferred channel heat exchanger comprises two coupled flat plates and a plurality of fins coupled to the flat plates. At least one of the plates preferably to receive flow of a fluid in a heated state. The fluid preferably carries heat from a heat source (such as a CPU, for example). Specifically, at least one of the plates preferably comprises a plurality of condenser channels configured to receive, to condense, and to cool the fluid in the heated state. The fluid in a cooler state is preferably carried from the device to the heat source, thereby cooling the heat source.

70 Claims, 10 Drawing Sheets

U.S. PATENT DOCUMENTS

| | | | | | |
|---|---|---|---|---|---|
| 4,450,472 | A | * | 5/1984 | Tuckerman et al. | 257/713 |
| 4,574,876 | A | * | 3/1986 | Aid | 165/46 |
| 4,644,385 | A | | 2/1987 | Nakanishi et al. | |
| 4,716,494 | A | | 12/1987 | Bright et al. | |
| 4,893,174 | A | | 1/1990 | Yamada et al. | |
| 4,978,638 | A | | 12/1990 | Buller et al. | |
| 5,043,797 | A | | 8/1991 | Lopes | |
| 5,083,194 | A | | 1/1992 | Bartilson | |
| 5,265,670 | A | * | 11/1993 | Zingher | 165/80.4 |
| 5,316,077 | A | * | 5/1994 | Reichard | 165/104.28 |
| 5,386,143 | A | | 1/1995 | Fitch | |
| 5,397,919 | A | | 3/1995 | Tata et al. | |
| 5,490,117 | A | | 2/1996 | Oda et al. | |
| 5,658,831 | A | | 8/1997 | Layton et al. | |
| 5,675,473 | A | | 10/1997 | McDunn et al. | |
| 5,696,405 | A | | 12/1997 | Weld | |
| 5,703,536 | A | | 12/1997 | Davis et al. | |
| 5,704,416 | A | | 1/1998 | Larson et al. | |
| 5,740,013 | A | | 4/1998 | Roesner et al. | |
| 5,763,951 | A | | 6/1998 | Hamilton et al. | |
| 5,768,104 | A | | 6/1998 | Salmonson et al. | |
| 5,880,524 | A | | 3/1999 | Xie | |
| 5,886,870 | A | | 3/1999 | Omori | |
| 5,901,037 | A | * | 5/1999 | Hamilton et al. | 361/699 |
| 5,921,087 | A | | 7/1999 | Bhatia et al. | |
| 5,940,270 | A | | 8/1999 | Puckett | |
| 5,964,092 | A | | 10/1999 | Tozuka et al. | |
| 6,021,045 | A | | 2/2000 | Johnson | |
| 6,119,729 | A | | 9/2000 | Oberholzer et al. | |
| 6,140,860 | A | | 10/2000 | Sandhu et al. | |
| 6,167,948 | B1 | | 1/2001 | Thomas | |
| 6,347,036 | B1 | | 2/2002 | Yeager et al. | |
| 6,366,467 | B1 | | 4/2002 | Patel et al. | |
| 6,397,932 | B1 | | 6/2002 | Calaman et al. | |
| 6,443,222 | B1 | | 9/2002 | Yun et al. | |
| 6,449,157 | B1 | | 9/2002 | Chu | |
| 6,449,162 | B1 | | 9/2002 | Corbin, Jr. et al. | |
| 6,457,515 | B1 | | 10/2002 | Vafai et al. | |
| 6,459,581 | B1 | | 10/2002 | Newton et al. | |
| 6,459,582 | B1 | | 10/2002 | Ali et al. | |
| 6,477,045 | B1 | | 11/2002 | Wang | |
| 6,492,200 | B1 | | 12/2002 | Park et al. | |
| 6,578,626 | B1 | | 6/2003 | Calaman et al. | |
| 6,588,498 | B1 | | 7/2003 | Reysin et al. | |
| 6,600,220 | B2 | | 7/2003 | Barber et al. | |
| 6,606,251 | B1 | | 8/2003 | Kenny, Jr. et al. | |
| 6,743,664 | B2 | | 6/2004 | Liang et al. | |
| 2002/0075645 | A1 | | 6/2002 | Kitano et al. | |
| 2002/0121105 | A1 | | 9/2002 | McCarthy, Jr. et al. | |
| 2003/0062149 | A1 | | 4/2003 | Goodson et al. | |
| 2003/0121274 | A1 | | 7/2003 | Wightman | |
| 2004/0040695 | A1 | | 3/2004 | Chesser et al. | |
| 2004/0052049 | A1 | | 3/2004 | Wu et al. | |
| 2004/0089008 | A1 | | 5/2004 | Tilton et al. | |
| 2004/0125561 | A1 | | 7/2004 | Gwin et al. | |
| 2004/0160741 | A1 | | 8/2004 | Moss et al. | |
| 2004/0188069 | A1 | | 9/2004 | Tomioka et al. | |

OTHER PUBLICATIONS

Michael B. Kleiner et al., "High Performance Forced Air Cooling Scheme Employing Microchannel Heat Exchangers", 1995, IEEE Transactions on Components, Packaging, and Manufacturing Technology–Part A, vol. 18, No. 4, pp. 795–804.

Jerry K. Keska Ph. D. et al., "An Experimental Study on an Enhanced Microchannel Heat Sink for Microelectronics Applications", EEP–vol. 26–2, Advances in Electronic Packaging, 1999, vol. 2, pp. 1235–1259.

A. J. Arnold et al., "Heat Sink Design for Cooling Modules in a Forced Air Environment", IBM Technical Disclosure Bulletin, vol. 22, No. 6, Nov. 1979, pp. 2297–2298.

"Forced Boiling Cooling System with Jet Enhancement for Crititical Heat Flux Extension", IBM Technical Disclosure Bulletin, vol. 39, No. 10, Oct. 1996, p. 143.

"Self–Contained Active Heat Dissipation Device", IBM Technical Disclosure Bulletin vol. 39, No. 4, Apr. 1996, pp. 115–116.

"Pin Fin Array Heat Pipe Apparatus", IBM Technical Disclosure Bulletin, vol. 37, No. 09, Sep. 1994, p. 171.

Mali Mahalingam, *Thermal Management in Semiconductor Device Packaging*, 1985, Proceedings of the IEEE, vol. 73, No. 9, Sep. 1985, pp. 1396–1404.

Roy W. Knight et al., *Optimal Thermal Design of Air cooled Forced Convection finned Heat Sinks—Experimental Verification*, Oct. 1992, IEEE Transactions on Components, Hybrids, and Manufacturing Technology, vol. 15, No. 5 pp. 754–760.

* cited by examiner

CHANNELED FLAT PLATE FIN HEAT EXCHANGE SYSTEM, DEVICE AND METHOD

RELATED APPLICATION

This Patent Application claims priority under 35 U.S.C. 119 (e) of the now abandoned U.S. Provisional Patent Application, Ser. No. 60/423,009, filed Nov. 1, 2002 and entitled "METHODS FOR FLEXIBLE FLUID DELIVERY AND HOTSPOT COOLING BY MICROCHANNEL HEAT SINKS" which is hereby incorporated by reference. This Patent Application also claims priority under 35 U.S.C. 119 (e) of the now abandoned U.S. Provisional Patent Application, Ser. No. 60/442,383, filed Jan. 24, 2003 and entitled "OPTIMIZED PLATE FIN HEAT EXCHANGER FOR CPU COOLING" which is also hereby incorporated by reference. In addition, this Patent Application claims priority under 35 U.S.C. 119 (e) of the now abandoned U.S. Provisional Patent Application, Ser. No. 60/455,729, filed Mar. 17, 2003 and entitled MICROCHANNEL HEAT EXCHANGER APPARATUS WITH POROUS CONFIGURATION AND METHOD OF MANUFACTURING THEREOF", which is hereby incorporated by reference.

FIELD OF THE INVENTION

This invention relates to the field of heat exchangers. More particularly, this invention relates to systems, devices for, and methods of utilizing a fluid cooled channeled flat plate fin heat exchange device in an optimal manner.

BACKGROUND OF THE INVENTION

Each advance in electronic components can cause increases in heat generation in a smaller package size. Due to these factors, there is a need for dissipation of the heat generated by these components. For example, there is a current need to dissipate heat from personal computer Central Processing Units (CPUs) in the range of 50 to 150 W.

Forced and natural convection air cooling methods, used in conjunction with heat sinks and heat pipes, currently serve as the predominant method of cooling electronics. The current conventional air cooling systems that use aluminum extruded or die-casting fin heat sinks are not sufficient for cooling the high heat flux of chip-surfaces or for large heat dissipation with low thermal resistance and compact size. Further, these air-cooled heat sinks require a substantial surface area to effectively function. To be able to transfer the increased heat load, the air-cooled heat sinks have become even larger. This requires the use of larger fans to overcome back-pressures caused by the large heat sinks. In other words, current air-cooled heat sinks require substantial space on the one hand, while blocking airflow entry and escape paths on the other. Thus, current cooling methods are unequal to the task of removing heat.

Moreover, the use of progressively larger fans increases the amount of acoustic noise generated by the cooling system and also increases the amount of electric power drawn by the system. For example, conventional solutions include use of multiple heat pipes to carry the heat to large heat sinks via high airflow. This leads to solution with high noise levels, which are undesirable.

Furthermore, a shortcoming of current traditional fan based heat dissipation methods is that heat is transferred in only one direction because a fan is placed to blow air in one direction over the heat sink. This limitation causes non-uniform temperature gradients across the heat sink and correspondingly, across the electronic component.

Due to these factors, and other shortcomings, there is a need for a more efficient and effective cooling system.

SUMMARY OF THE INVENTION

A device, method, and system for a fluid cooled channeled heat exchange device is disclosed. The fluid cooled channeled heat exchange device utilizes fluid circulated through a channel heat exchanger for high heat dissipation and transfer area per unit volume. The device comprises a highly thermally conductive material, preferably with less than 200 W/m-K. The preferred channel heat exchanger comprises two coupled flat plates and a plurality of fins coupled to the flat plates. At least one of the plates preferably to receive flow of a fluid in a heated state. The fluid preferably carries heat from a heat source (such as a CPU, for example). Specifically, at least one of the plates preferably comprises a plurality of condenser channels configured to receive, to condense, and to cool the fluid in the heated state. The fluid in a cooler state is preferably carried from the device to the heat source, thereby cooling the heat source.

The miniaturization of electronic components has created significant problems associated with the heating of integrated circuits. More and more, effective cooling of heat flux levels exceeding 100 W/cm$^2$ from a relatively small surface area is required. Currently, there is a need for compact thermal solutions for electronic devices with high heat (power) density. For example, the upward trend in chip power with shrinking die sizes has lead to extremely high power density in high performance processors for which effective thermal solutions do not exist.

Due to its low density, air has a limited ability to carry heat per pound. In contrast, liquids are capable of carrying a substantially greater amount of heat per pound, due to their greater density. For example, forced-air cooling has an approximate heat-transfer coefficient of 20 W/m$^{2}$° C., while moving water has an approximate heat-transfer coefficient of 9000 W/m$^{2}$° C.

By utilizing the current fluid cooled invention, heat may be dissipated with a significant reduction in the amount of surface area required due to the higher heat-transfer rate. In addition, the invention currently disclosed dissipates more heat with considerably less flow volume and acoustic noise. Further, the current invention addresses the need to maintain temperature uniformity in the X-Y direction. The preferred embodiment of the current invention maintains substantial temperature uniformity at the X-Y direction in addition to dissipating heat to the ambient with low thermal resistance.

Embodiments of the fluid cooled channeled heat exchange device presently disclosed provide extremely high heat transfer area per unit volume. The geometric parameters have a significant influence on the convective heat transfer characteristics. Therefore, designs of systems using the present invention preferably optimize key parameters, allowing the fluid cooled channeled flat plate fin heat exchange device to serve as an efficient and economical means to dissipate high heat per unit volume.

DETAILED DESCRIPTION OF THE PREFERRED EMBODIMENT

Unlike prior art, embodiments of the fluid cooled channeled flat plate fin heat exchange device disclosed in the current invention provide high heat transfer area per unit volume in an optimal manner for use in cooling heat sources including electronic components such as, but not limited to, CPU's, integrated circuits, and microprocessors. Further, the current invention optimizes temperature uniformity in the X-Y direction of the heat exchange device in addition to dissipating heat to the ambient with low thermal resistance—a shortcoming of current traditional heat dissipation methods which only transfer heat in one direction. For example, embodiments of the current invention can dissipate heat fluxes exceeding 100 W/cm$^2$ by utilizing fluid cooled channels etched in silicon or other materials.

The channels of the preferred embodiment of the fluid cooled channeled heat exchange device comprise channels with a hydraulic diameter below 5 millimeters. In addition to the fluid cooled channels, high aspect ratio fins are necessary to dissipate heat to the ambient with low thermal resistance.

Figure 1A:
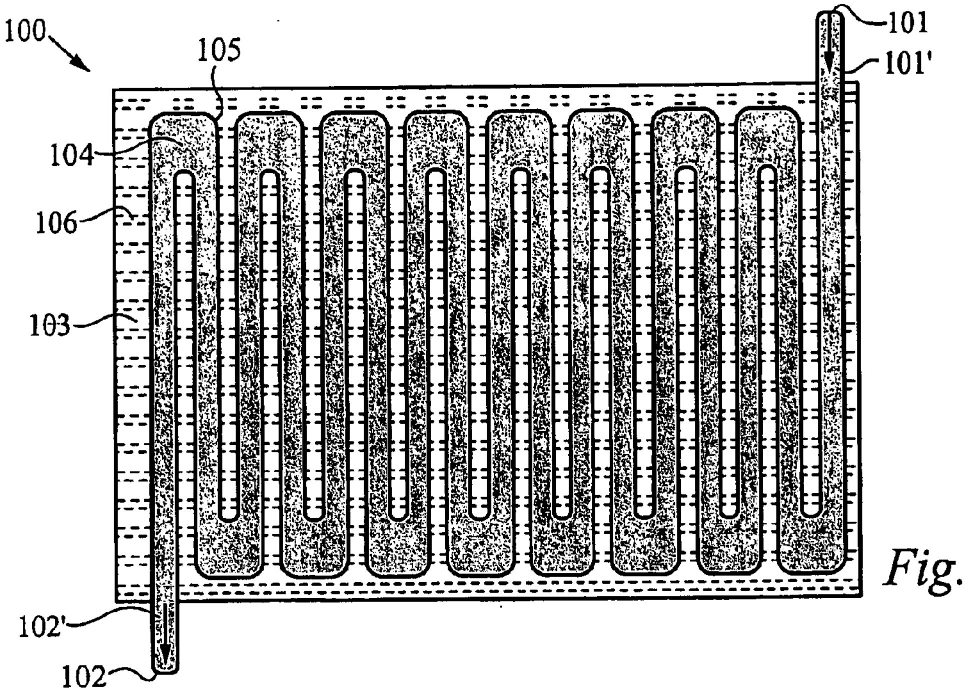
FIG. 1A illustrates the top view of the base plate of a fluid cooled channeled flat plate fin heat exchange device in which the fluid directly contacts the channels for single phase cooling, in accordance with the instant invention.

The device for single phase fluid cooled channeled heat exchange 100 is shown in FIGS. 1A, 1B, 1C, 1D, and 1E. FIG. 1A illustrates the top view of the base plate of a fluid cooled channeled flat plate fin heat exchange device in which the fluid directly contacts the channels for single phase cooling, in accordance with the instant invention.

Specifically, FIG. 1A shows a flat plate heat exchange device 100. The device 100 comprises a top plate 103' (FIGS. 1C–E) and a base plate 103 coupled together. Further, the device 100 comprises a plurality of fins 106 coupled to the top plate 103' (FIGS. 1C–E). The base plate 103 comprises a fluid inlet 101 configured to receive flow of a fluid in a heated state therethrough. In addition, the base plate 103 preferably comprises a plurality of condenser channels 104 coupled to the fluid inlet 101. The plurality of condenser channels 104 are configured to receive and to cool the fluid which is in the heated state. In addition, the base plate 103 comprises a fluid outlet 102 coupled to the plurality of condenser channels 104. This fluid outlet 102 is configured to receive the cooled fluid and to allow the cooled fluid to exit the base plate 103. In alternate embodiments, the plurality of condenser channels 104 are further configured to condense the fluid.

The flat plate heat exchange device 100 preferably comprises a highly thermally conductive material, preferably with less than 200 W/m-K, such as aluminum. In alternate embodiments, the flat plate heat exchange device 100 comprises semiconducting material. Other embodiments comprise a material with a thermal conductivity value larger than 200 W/m-K.

Fluid carrying heat from a heat source (such as a CPU, for example) enters the device 100 from one side and exits from the opposite side of the device 100. Specifically, fluid enters the device 100 through the fluid inlet 101 in the direction as shown by the arrow 101'. The fluid exits the device 100 through the fluid outlet 102 in the direction as shown by the arrow 102'. The fluid utilized in the cooling process is preferably water, yet in alternative embodiments, the fluid is selected from a group comprising of water, ethylene glycol, isopropyl alcohol, ethanol, methanol, and hydrogen peroxide. In other embodiments, the fluid is selected from one of a liquid and a combination of a liquid and a vapor. While the fluid inlet 101 and the fluid outlet 102 are shown on opposite sides of the device 100, it will be appreciated that they can also be on the same side or adjacent sides as well.

The top plate 103' (FIGS. 1C–E) and the base plate 103 of the flat plate heat exchange device 100 are preferably coupled by fittings. One sample of the dimension of the flat plate heat exchange device 100 is 120 mm×90 mm×88 mm. In the preferred embodiment of the current invention, the top plate 103' (FIGS. 1C–E) of the flat plate heat exchange device 100 is flat and is configured to complimentary couple with the base plate 103 of the device 100. The base plate 103 preferably comprises a plurality of condenser channels 104 configured to permit flow of a fluid therethrough. The plurality of condenser channels 104 are preferably machined, followed by plating (preferably comprising nickle or an alternative such as copper) onto the base plate to allow for high aspect ratios for the channels. High aspect ratios are preferred, particularly for single-phase fluid flow. The manufacturing techniques that currently exist that can achieve these aspect ratios include plasma etching, LIGA manufacturing, and semiconductor manufacturing techniques (primarily silicon).

In alternate embodiments, the condenser channels 104 comprise silicon. Silicon offers an alternate embodiment for the condenser channels 104 due to its reasonably high thermal conductivity (~120 W/m-K), which allows the heat to conduct effectively up the sidewalls of the channels. In yet other embodiments, materials for the condenser channels 104 include silicon carbide and diamond. Further, in alternate embodiments, the plurality of condenser channels 104 comprises a high aspect ratio micromachining material or precision machined metals or alloys.

In the preferred embodiment of the current invention, the condenser channels 104 have depths in the range of 1 to 6 millimeters and widths in the range of 0.5 to 4 millimeters. These aspect ratios allow large amounts of fluid to be pumped through the fluid cooled channeled heat exchange device with minimal pressure drop, while simultaneously allowing all of the fluid to maintain a high thermal convection coefficient with the channel sidewalls.

In alternate embodiments, the plurality of condenser channels 104 are stamped onto the base plate 103. In yet other embodiments, a conductive fluid proof barrier (not shown) coupled to the base plate 103 and the top plate 103' (FIGS. 1C–E) is configured to hold a microprocessor interposed between the top plate and the fluid proof barrier.

Still referring to FIG. 1A, the plurality of condenser channels 104 preferably have rounded corners 105 and are preferably in a serpentine configuration. The serpentine configuration illustrated in FIG. 1A is one of many embodiments of a serpentine embodiment. In alternate embodiments of the current invention, the plurality of condenser channels 104 are in a parallel, a radial, a spiral, or an angular configuration. Channels with a spiral geometry are discussed below as alternate embodiments of the current invention. Regardless of the condenser channel configuration geometry, rounded corners 105 are utilized for the plurality of condenser channels 104 so as to minimize pressure drops.

A plurality of fins 106 are coupled to the base plate 103 of the flat plate heat exchange device. The plurality of fins 106 shown in FIG. 1A are in a perpendicular configuration with respect to the condenser channels 104. In other words, the plurality of fins 106 allow air to flow perpendicular to the plurality of condenser channels 104 as shown in FIG. 1D. But the plurality of fins 106 are preferably parallel to the plurality of condenser channels 104. The preferred parallel fin configuration is illustrated in FIG. 1C while the perpendicular configuration is illustrated in FIG. 1D. The parallel fin configuration illustrated in FIG. 1C is one of many embodiments of a parallel embodiment while the perpendicular fin configuration illustrated in FIG. 1D is one of many embodiments of a perpendicular embodiment. A second plurality of fins 106' (FIGS. 1C–E), similar to the plurality of fins 106, are coupled to the top plate 103' (FIGS. 1C–E) of the flat plate heat exchange device 100. The plurality of fins 106 and the second plurality of fins 106' (FIGS. 1C–E) preferably have an airflow rate of 45 cfm going across the plurality of fins. In alternate embodiments, the plurality of fins are in a pin, a spiral, or a radial configuration.

The two plate halves of the flat plate heat exchange device 100 (with respective fins) are coupled together as shown in FIGS. 1C, 1D, and 1E. Alternatively, the plurality of fins 106 are soldered onto each plate half, followed by joining of the two halves together by soldering or brazing.

The plurality of fins 106 and the base plate 103 and the second plurality of fins 106' (FIGS. 1C–E) and the top plate 103' (FIGS. 1C–E) of the flat plate heat exchange device 100 preferably comprise aluminum and are preferably coupled by an anodic bonding method. In alternate embodiments, these components are coupled by fusion bonding, eutectic bonding, adhesive bonding, brazing, welding, soldering, epoxy, or similar methods. In addition, the flat plate heat exchange device 100 is in a monolithic configuration (i.e. the components of the device consist of, constitute, or are formed from a single unit) in other embodiments.

The preferred embodiment of the current invention is configured to receive a fluid in a heated state from a heat source. Further, the invention is preferably coupled to a pump or other means for supplying fluid (not shown) and to a means for airflow generation such as a fan (not shown) to allow for greater dissipation of heat to the ambient. The fluid in a heated state is received by the device 100 and the heat is dissipated by circulating the heated fluid through the plurality of condenser channels 104. The heated fluid is preferably brought to the heat exchange device by a pump. In alternate embodiments of the current invention, the heat source, such as a microprocessor, is interposed between the components of the device 100. In yet other embodiments of the current invention, the device 100 is otherwise coupled to a heat source directly.

The preferred embodiment of the current invention cools 120 W of heat from a CPU with a water flow rate of 150 ml/min. Unlike prior inventions, the multi-pass arrangement of the current invention for the fluid flow path leads to efficient cooling in a compact volume.

Figure 1B:
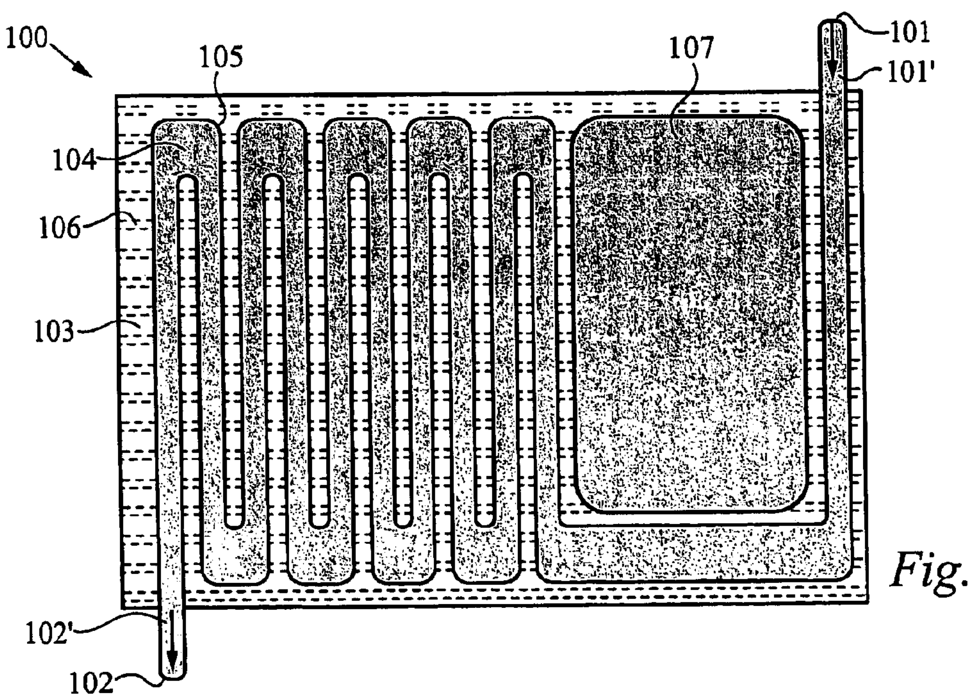
FIG. 1B illustrates the top view of the base plate of a fluid cooled channeled flat plate fin heat exchange device comprising a separate sealed gap in which the fluid directly contacts the channels for single phase cooling, in accordance with the instant invention.
Figure 1C:
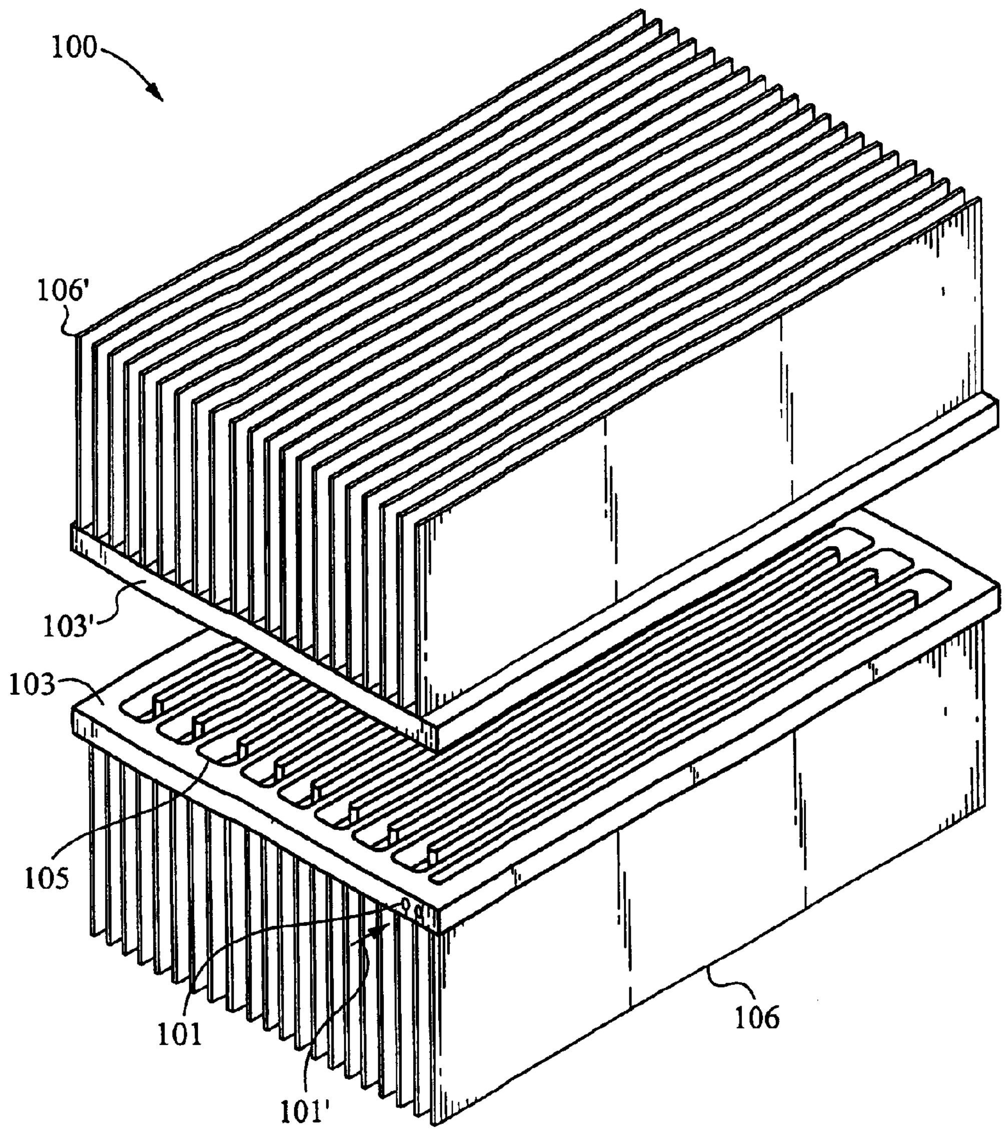
FIG. 1C illustrates the partially exploded view of a flat plate heat exchange device comprising a top plate, a base plate with channels, and parallel heat sink fins, in accordance with the instant invention.
Figure 1D:
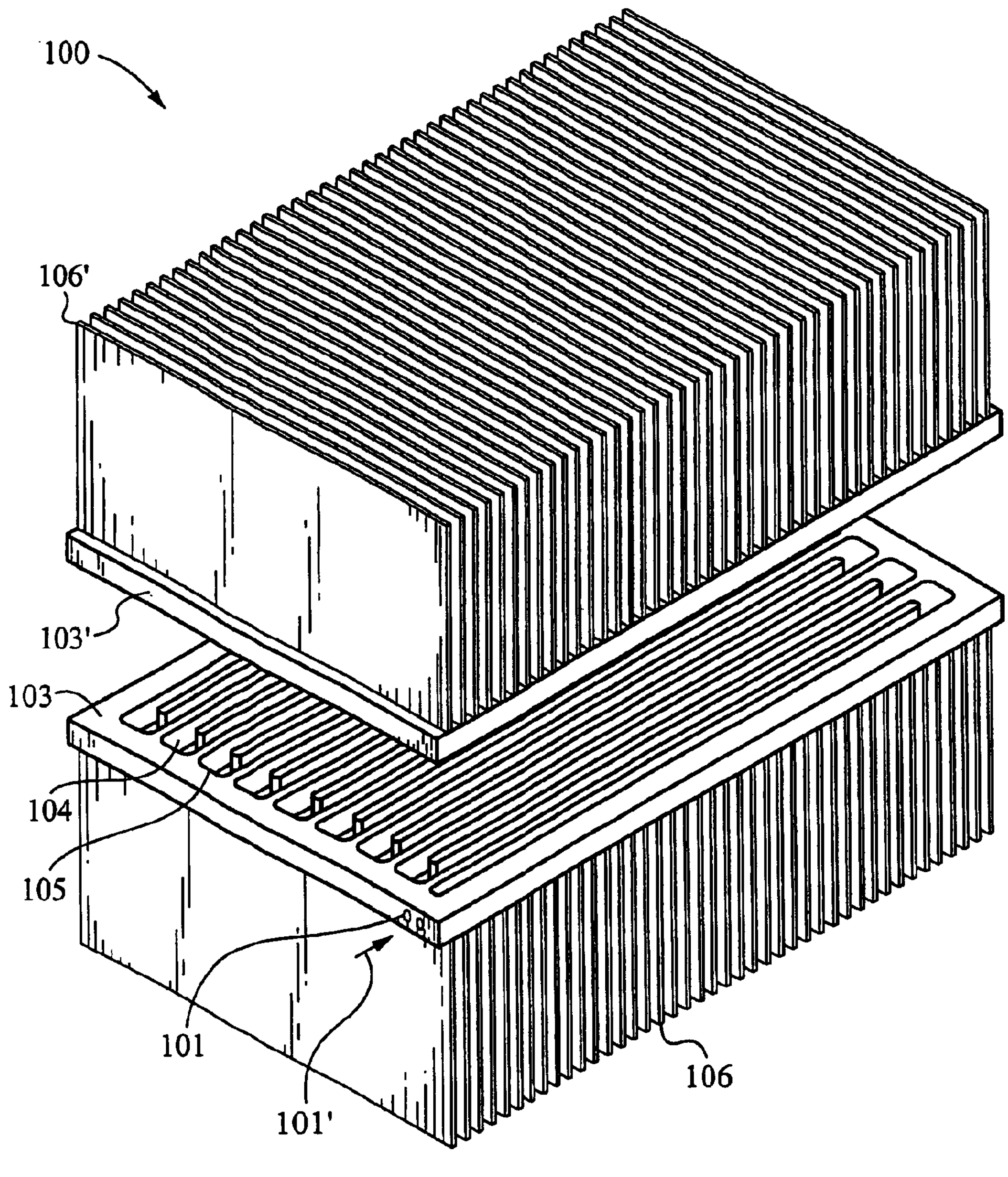
FIG. 1D illustrates the partially exploded view of a flat plate heat exchange device comprising a top plate, a base plate with channels, and perpendicular heat sink fins, in accordance with the instant invention.
Figure 1E:
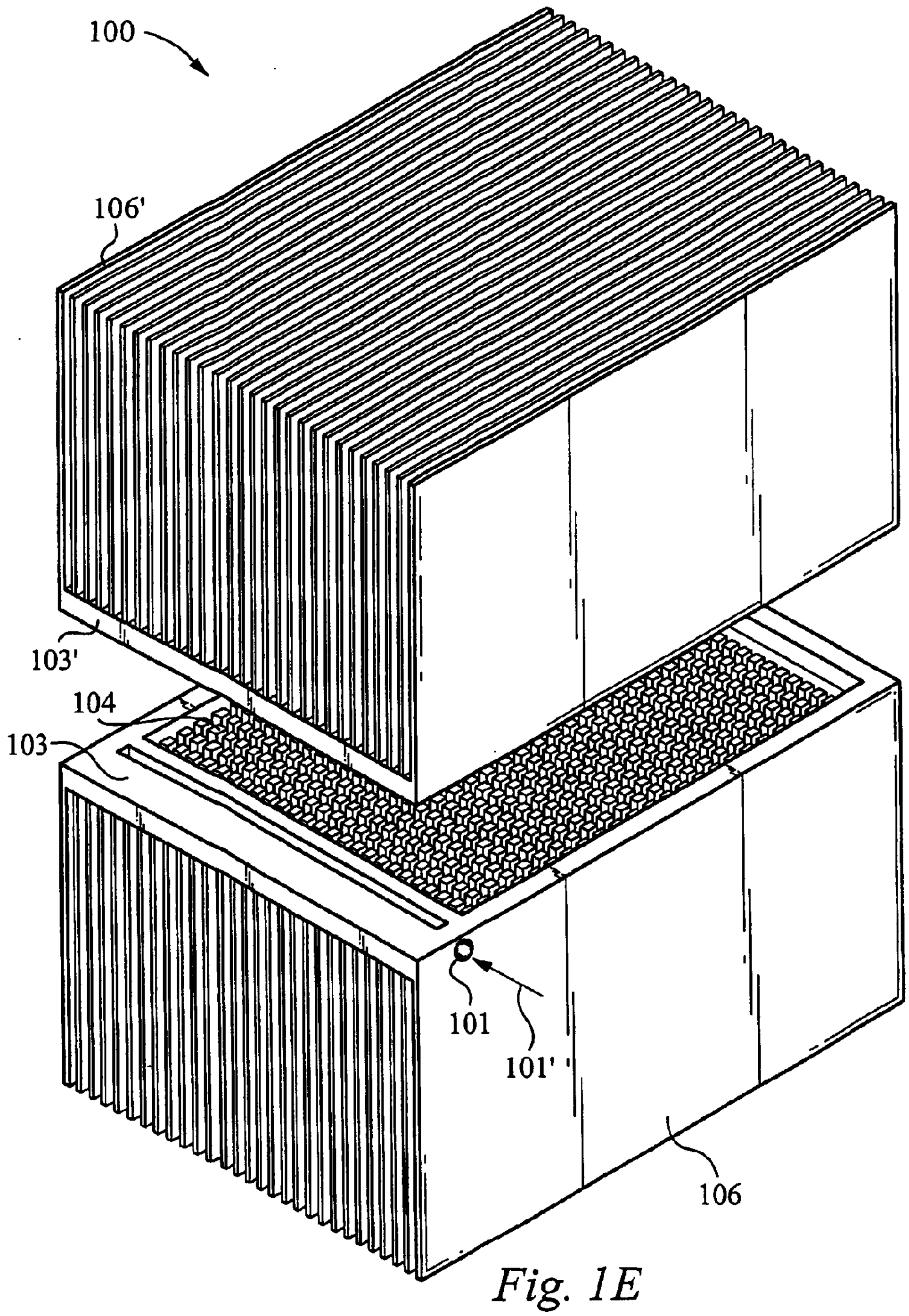
FIG. 1E illustrates the partially exploded view of a flat plate heat exchange device comprising a top plate, a base plate comprising pins, and parallel heat sink fins, in accordance with the instant invention.

FIG. 1B illustrates and embodiment of the device 100 wherein the device 100 discussed in FIG. 1A further comprises a plurality of separate sealed gaps 107. As shown in FIG. 1B, the plurality of separate sealed gaps 107 are coupled in between the fluid inlet 101 and the plurality of condenser channels 104. The separate sealed gaps 107 are not traversed by fluid and are preferably filled with a gas. These separate sealed gaps 107 serve to prevent temperature changes in the fluid during the movement of the fluid, for example, from the inlet 101, through the plurality of condenser channels 104, to the outlet 102. It should be understood that the location of the separate sealed gaps 107 shown in FIG. 1B serves only as an illustration. It should also be understood that additional pluralities of separate sealed gaps are utilized in alternate embodiments. For example, in an alternate embodiment, a plurality of separate sealed gaps (not shown) are coupled in between the plurality of condenser channels 104. Or, in alternate embodiments, a plurality of separate sealed gaps (not shown) are coupled in between the fluid outlet 102 and the plurality of condenser channels 104.

FIG. 1C illustrates the perspective view of the single phase fluid cooled channeled heat exchange device 100 discussed in detail above. The device 100 is preferably flat. The flat plate heat exchange device 100 comprises a base plate 103 and a top plate 103'. Fluid enters the device 100 through the fluid inlet 101 in the direction as shown by the arrow 101'. The fluid exits the device 100 through the fluid outlet 102 (FIG. 1A). As discussed above, the base plate 103 comprises a plurality of condenser channels 104 configured to permit flow of a fluid therethrough. The plurality of condenser channels 104 have rounded corners 105 and are preferably machined, followed by nickel plating, onto the base plate 103 of the flat plate heat exchange device 100.

As noted in the discussion of FIG. 1A, the plurality of fins 106 are coupled to the base plate 103 of the flat plate heat exchange device 100 in a parallel configuration with respect to the condenser channels. Similarly, a second plurality of fins 106' are coupled to the top plate 103' of the flat plate heat exchange device. Alternatively, the fins 106' are integrally formed with the top plate 103'.

FIG. 1D illustrates yet another embodiment of the current invention, where the plurality of fins 106 are coupled to the base plate 103 of the flat plat heat exchange device in a perpendicular configuration, as described above in the discussion of FIG. 1A.

FIG. 1E illustrates yet another embodiment of the current invention, where the plurality of fins 106 are coupled to the base plate 103 of the flat plat heat exchange device in a parallel configuration. The flat plate heat exchange device 100 comprises a base plate 103 and a top plate 103'. Fluid enters the device 100 through the fluid inlet 101 in the direction as shown by the arrow 101'. The fluid exits the device 100 through the fluid outlet (not shown). The base plate 103 comprises a plurality of pins 104 configured to permit flow of a fluid therethrough. The plurality of pins preferably protrude from and are perpendicular to the surface of the base plate 103.

Figure 2A:
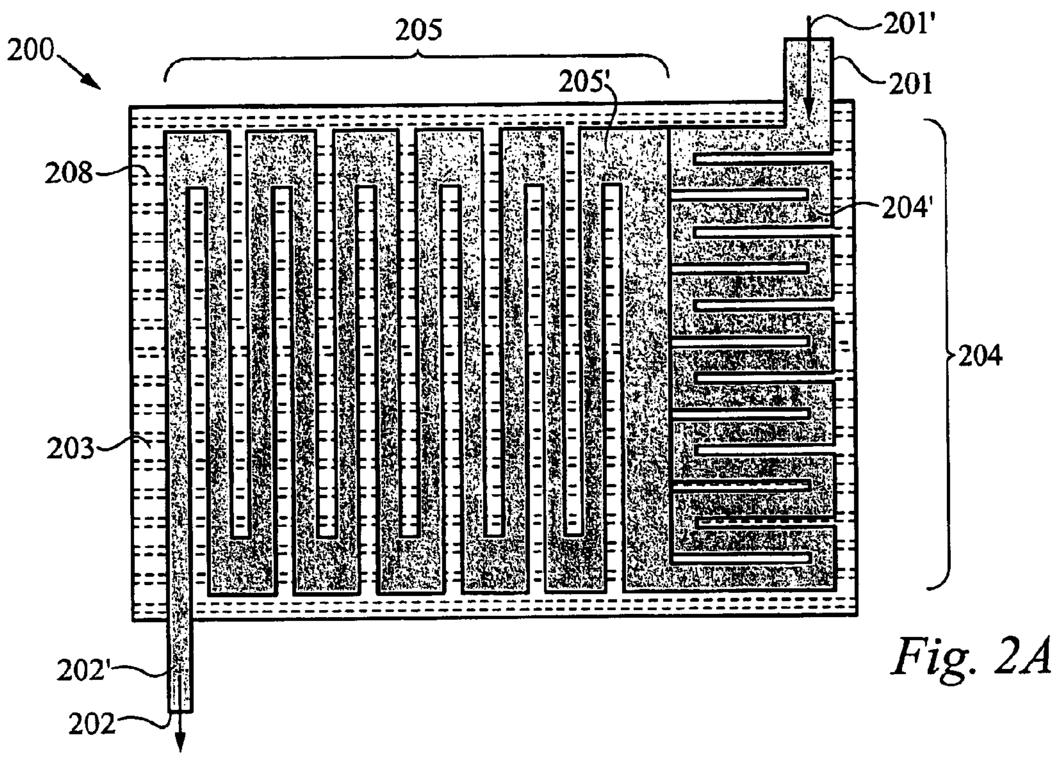
FIG. 2A illustrates the top view of the base plate of a fluid cooled channeled flat plate fin heat exchange device configured for two-phase cooling, in which the fluid directly contacts the channels, in accordance with the instant invention.

FIG. 2A illustrates the top view of the base plate of a fluid cooled channeled flat plate fin heat exchange device 200 configured for two-phase cooling. The fluid directly contacts the channels of the device 200. The effectiveness of the two phase cooling depends on the fluid flow rate and channel geometry for a fixed airflow speed. The surface area to volume ratio is a key parameter which governs the cooling efficiency in the fluid channel. The fluid pressure drop in the heat exchange device is also dependent on the total channel length, the number of bends, as well as the width of the bends of the condenser channels.

Fluid enters the device 200 through the fluid inlet 201 in the direction as shown by the arrow 201'. The input fluid is preferably a liquid, but can also be in two phase flow such as a vapor, or vapor and liquid mixture. The fluid exits the device 200 through the fluid outlet 202 in the direction as shown by the arrow 202'. The output fluid is preferably liquid. While the fluid inlet 201 and the fluid outlet 202 are shown on opposite sides of the heat exchange device 200, it will be appreciated that they can also be on the same side or adjacent sides as well.

In the two phase cooling embodiment, a unique channel geometry with regions for two phase condensation and single phase fluid cooling are utilized. The two phase condensation region is essentially several two phase channels connected to reduce vapor pressure drop in the two phase region. After condensation, heated single phase fluid travels in a multi-pass condenser channels to exit the heat exchange device at the cold side.

Specifically, the device 200 comprises a top plate (not shown) and a base plate 203 coupled together. The device 200 further comprises a plurality of fins 208 coupled to the bottom plate 203. In the preferred embodiment, the device 200 further comprises a second plurality of fins (not shown) coupled to the top plate. The flat plate heat exchange device 200 and the plurality of fins 208 preferably comprise a highly thermally conductive material, preferably less than 200 W/m-K, such as aluminum. In alternate embodiments, the flat plate heat exchange device 200 and the plurality of fins 208 comprise semiconducting material. Other embodiments comprise a material with a thermal conductivity value larger than 200 W/m-K.

The base plate 203 of the flat plate heat exchange device 200 comprises a single phase region 204 comprising a plurality of two phase channels 204' configured to permit flow of a fluid comprising either vapor, or liquid and vapor, therethrough, along a first axis. The fluid preferably comprises water, but in alternate embodiments, the fluid is from a group comprising of water, ethylene glycol, isopropyl alcohol, ethanol, methanol, and hydrogen peroxide. In other embodiments, the fluid is selected from one of a liquid and a combination of a liquid and a vapor.

The base plate 203 further comprises a condensation region 205 comprising a plurality of condenser channels 205' coupled to the plurality of two phase channels 204. The plurality of condenser channels 205' are configured to permit flow of the fluid therethrough, along a second axis, not parallel to (and preferably perpendicular to) the first axis and reduce vapor pressure drop to promote condensation. Preferably, the plurality of two phase channels 204' and the plurality of condenser channels 205' are in a serpentine configuration. The plurality of two phase channels 204' and the plurality of condenser channels 205' shown in FIG. 2A are one of many embodiments of a serpentine embodiment.

In alternate embodiments, the base plate 203 further comprises a second single phase region (not shown) comprising a plurality of single phase channels (not shown) coupled to the plurality of condenser channels 205'. The plurality of single phase channels are configured to permit flow of a fluid therethrough, along the first axis.

In an embodiment of the current invention, the device 200 is coupled to a heat source. The heat source preferably comprises a microprocessor, but includes other electronic component heat sources in alternate embodiments.

As in the single phase embodiment of FIG. 1A, the base plate 203 of the flat plate heat exchange device 200 is coupled to the plurality of two phase channels 204' and the plurality of condenser channels 205'. In addition, a plurality of fins 208 are coupled to the base plate 203 of the flat plate heat exchange device. A second plurality of fins (not shown), similar to the first plurality of fins 208, are coupled to the top plate (not shown) of the flat plate heat exchange device 200. The fins are preferably a series of parallel fins, but in alternate embodiments are in a perpendicular configuration or include pin fins, spiral fins, or radial fins. The two plate halves of the flat plate heat exchange device (with respective fins) are then coupled in the manner shown in FIG. 1C, 1D, relative to the embodiment of FIG. 1A, or FIG. 1E.

Simply stated, the single phase region 204 is the first section and is configured to permit flow of fluid (preferably a liquid, but may also be a vapor or a vapor and liquid mixture in other embodiments) in through the fluid inlet 201 and through the plurality of two phase channels 204'. The condensation region 205 is the second section and is configured to permit flow of single phase fluid through the plurality of condenser channels 205' and out through the fluid outlet 202. The plurality of fins 208 further dissipate the heat transferred by the fluid in the channels.

Figure 2B:
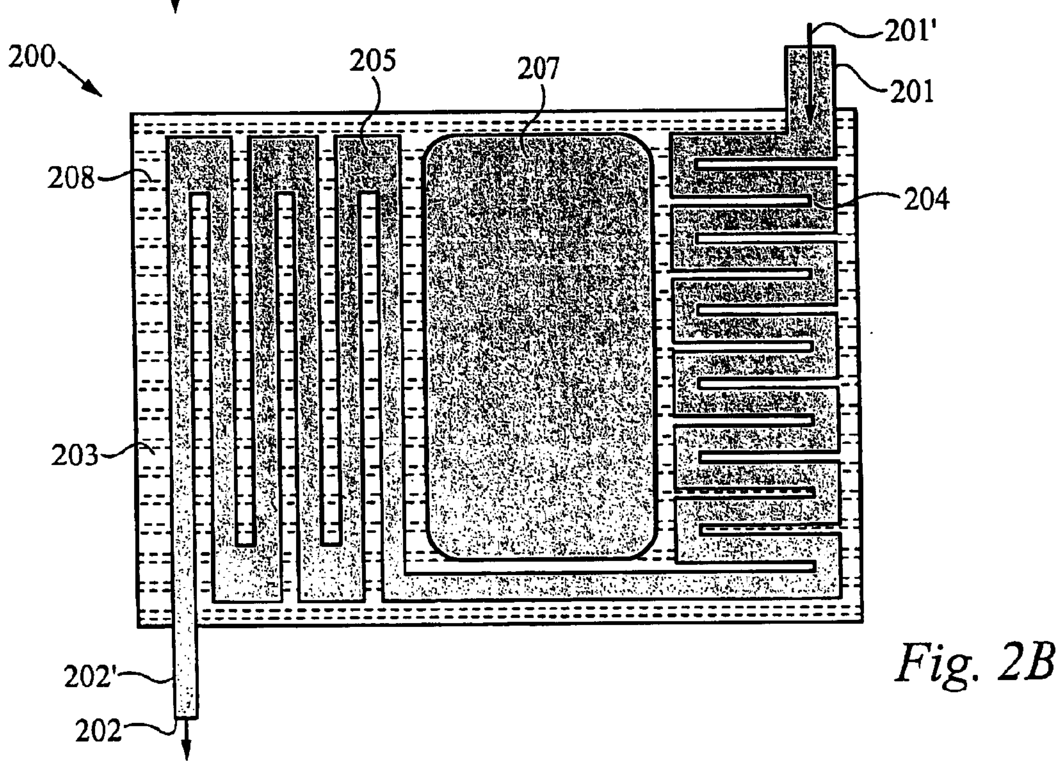
FIG. 2B illustrates the top view of the base plate of a fluid cooled channeled flat plate fin heat exchange device configured for two-phase cooling comprising a separate sealed gap, in which the fluid directly contacts the channels, in accordance with the instant invention.

Similar to the device shown in FIG. 1B, FIG. 2B illustrates the device 200 wherein the device further comprises a plurality of separate sealed gaps 207. These separate sealed gaps 207 are preferably coupled in between the plurality of two phase channels 204' of the single phase region 204 and the plurality of condenser channels 205' of the condensation region 205. The separate sealed gaps 207 are not traversed by fluid and are preferably filled with a gas. In embodiments of the current invention, the separate sealed gaps 207 serve to prevent temperature changes in the fluid during the movement of the fluid from the inlet 201 through the plurality of two phase channels 204', to the plurality of condenser channels 205', and through the outlet 202. It should be understood that the location of the separate sealed gaps 207 shown in FIG. 2B serves only as an illustration. It should also be understood that additional pluralities of separate sealed gaps are utilized in alternate embodiments. For example, in one embodiment, an additional plurality of separate sealed gaps (not shown) are coupled in between the fluid inlet 201 and the plurality of two phase channels 204'. Or, in alternate embodiments, an additional plurality of separate sealed gaps (not shown) are coupled in between the fluid outlet 202 and the plurality of condenser channels 205'.

Figure 3:
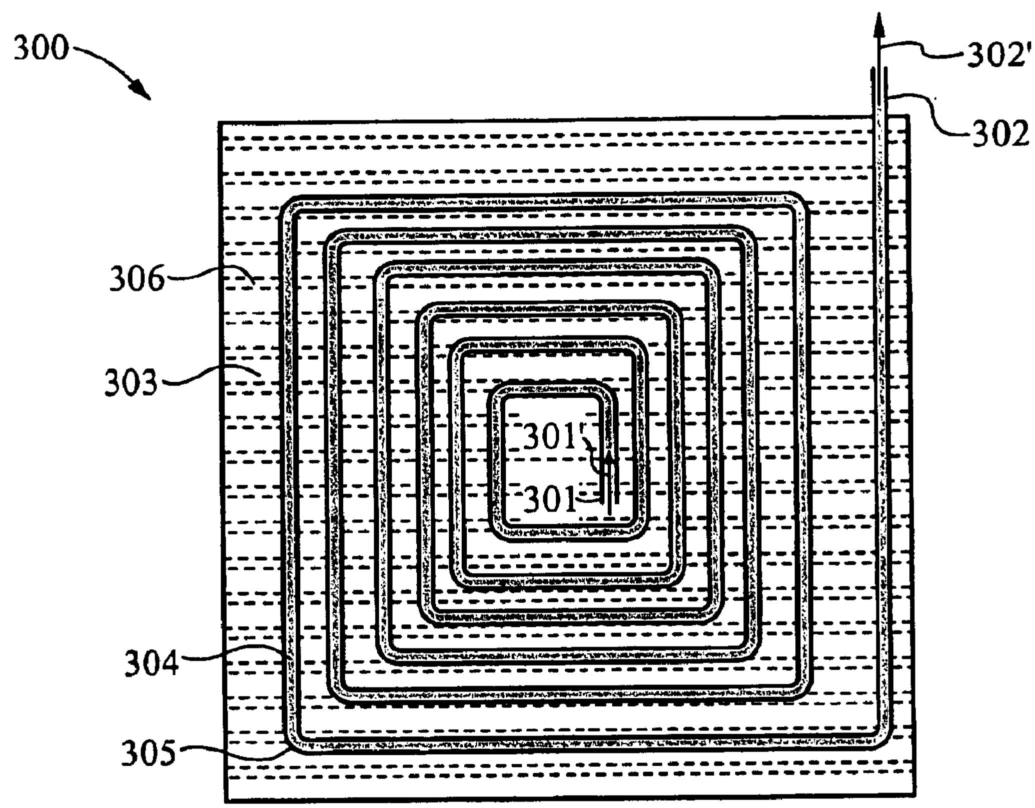
FIG. 3 illustrates the top view of the base plate of a fluid cooled channeled flat plate fin heat exchange device configured for single-phase cooling, in which the base plate channel is in a spiral geometry, in accordance with the instant invention.

FIG. 3 illustrates the top view of an alternate embodiment of the current invention in which the base plate channel 303 of the fluid cooled channeled flat plate fin heat exchange device 300 is in a spiral geometry configuration. The base plate channel 303 shown in FIG. 3 is one of many embodiments of a spiral geometry embodiment. In the embodiment shown in FIG. 3, warm fluid enters the device 300 from the middle, and spirals its way through the base plate 303 to make its exit at the periphery in a cooler state. The airflow from a fan (not shown) impinges on the plurality of fins 306 and the base plate, with a velocity gradient from center (lowest speed) to the edge (maximum speed). This results in a very compact configuration which saves space but also achieves efficient and effective heat dissipation.

More specifically, fluid enters the single phase fluid cooled channeled heat exchange device 300 through the fluid inlet 301 in the direction as shown by the arrow 301'. The fluid exits the device 300 through the fluid outlet 302 in the direction as shown by the arrow 302'. The device 300 shown in FIG. 3 comprises a top plate (not shown) and a base plate 303 coupled together such as shown in FIGS. 1C, 1D, relative to the embodiments of FIG. 1A or 1B, or FIG. 1E. In the preferred embodiment of the current invention, the top plate (not shown) of the flat plate heat exchange device 300 is flat and is configured to complimentary couple with the base plate 303. The base plate 303 comprises a plurality of channels 304 configured to permit flow of a fluid therethrough. The plurality of channels 304 are preferably machined, followed by nickel plating, onto the base plate 303 of the device 300. The plurality of channels 304 have rounded corners 305 and are in a spiral configuration, as shown. The channel cross section dimensions for such a spiral channel plate fin heat exchange device are in the range of 0.5 mm–3 mm wide, and 0.5 mm to 6 mm deep. The plurality of channels 304 shown in FIG. 3 are one of many embodiments of a spiral embodiment.

A first plurality of fins 306 is coupled to the base plate 303 of the flat plate heat exchange device 300. A second plurality of fins (not shown), similar to the first plurality of fins 306, are coupled to the top plate (not shown) of the flat plate heat exchange device. The fins are preferably a series of parallel fins, but in alternate embodiments, include a series of perpendicular fins, pin fins, spiral fins, or radial fins.

The two plate halves of the flat plate heat exchange device 300 (with respective fins) are then coupled. The first plurality of fins 306 and the base plate 303 and the second plurality of fins (not shown) and the top plate (not shown) of the flat plate heat exchange device 300 preferably are coupled by an anodic bonding method and comprise a highly thermally conductive material, preferably with less than 200 W/m-K, such as aluminum. In alternate embodiments, they comprise semiconducting material or a material with a thermal conductivity value larger than 200 W/m-K.

Figure 4:
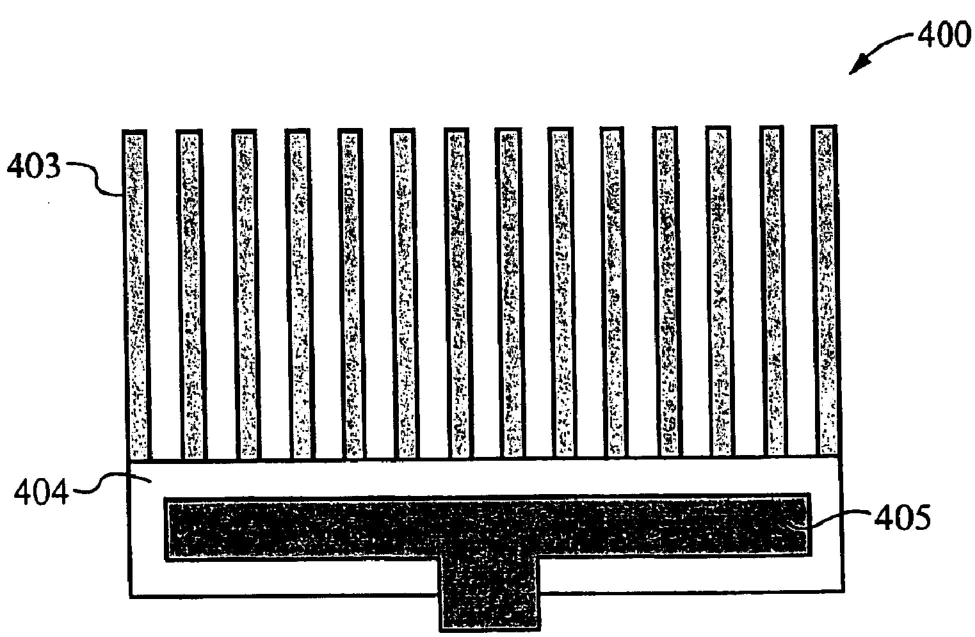
FIG. 4 illustrates a schematic side view of the base plate of the fluid cooled channeled flat plate fin heat exchange device shown in FIG. 3, in accordance with the instant invention.

FIG. 4 illustrates a schematic side view of a fluid cooled channeled heat exchange device 400. Although not shown, the channels in the base plate of the device 400 are configured in a spiral geometry as in FIG. 3.

Specifically, cool air flows in the direction into or out of the page of the drawing of FIG. 4. A fan (not shown) takes in cool air and blows the cool air onto the plurality of fins 403. The plurality of fins 403 are coupled to a flat plate heat exchange device 404. The flat plate heat exchange device 404 comprises a plurality of channels contained within a coupled base plate and top plate channel section 405. The channel section 405 is configured to permit flow of fluid therethrough as described in detail above. The plurality of fins 403 shown in FIG. 4 and the other components of the device 400 are also described in detail above.

Figure 5:
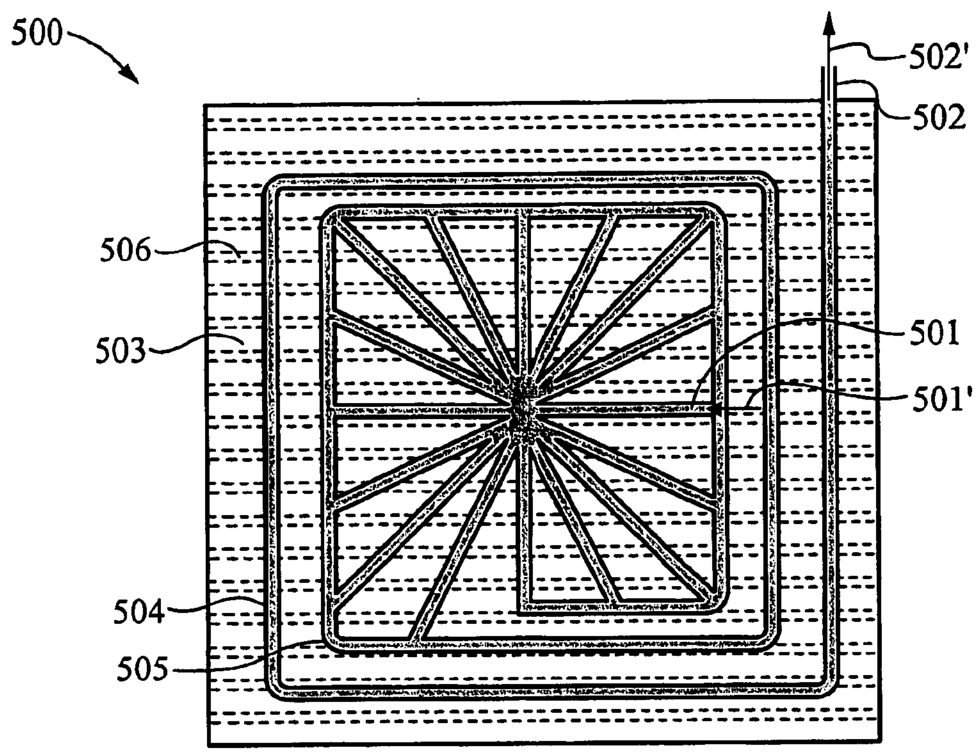
FIG. 5 illustrates the top view of the base plate of a fluid cooled channeled flat plate fin heat exchange device configured for single phase cooling, in which the base plate channel is in a radial geometry, in accordance with the instant invention.

FIG. 5 illustrates the top view of the base plate of a fluid cooled channeled flat plate fin heat exchange device 500 configured for two-phase cooling, in which the base plate channel is in a radial geometry. The base plate channel shown in FIG. 5 is one of many embodiments of a radial geometry embodiment. Specifically, fluid enters the device 500 through the fluid inlet 501 in the direction as shown by the arrow 501'. The fluid exits the device 500 through the fluid outlet 502 in the direction as shown by the arrow 502'. The device 500 shown in FIG. 5 comprises a top plate (not shown) and a base plate 503 coupled together and comprising a highly thermally conductive material, preferably with less than 200 W/m-K, such as aluminum. In alternate embodiments, the flat plate heat exchange device 500 comprises semiconducting material. Other embodiments comprise a material with a thermal conductivity value larger than 200 W/m-K.

In the preferred embodiment of the current invention, the top plate (not shown) of the flat plate heat exchange device 500 is flat and the base plate 503 comprises a plurality of channels 504 configured to permit flow of a fluid therethrough. The plurality of channels 504 are preferably machined, followed by nickel plating, onto the base plate 504 of the device 500. The plurality of channels 504 have rounded corners 505 and are in a radial configuration.

A plurality of fins 506 are coupled to the base plate 503. A second plurality of fins (not shown), similar to the plurality of fins 506, are coupled to the top plate (not shown) of the flat plate heat exchange device 500. The fins are preferably in a series of parallel fins, but in alternate embodiments, include a series of perpendicular fins, pin fins, spiral fins, or radial fins. The two plate halves of the flat plate heat exchange device 500 (with respective fins) are then coupled. The plurality of fins 506 and the base plate 503 and the second plurality of fins (not shown) and the top plate (not shown) of the device 500 preferably comprise aluminum and are preferably coupled by an anodic bonding method.

Figure 6:
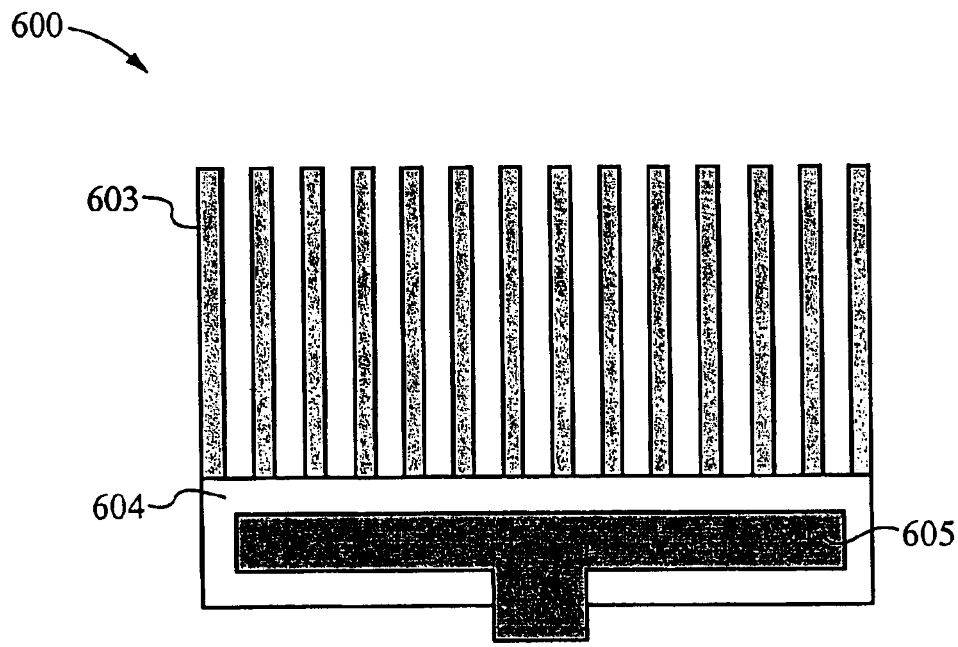
FIG. 6 illustrates a schematic side view of the base plate of a fluid cooled channeled flat plate fin heat exchange device shown in FIG. 5, in accordance with the instant invention.

FIG. 6 illustrates a schematic side view of a two-phase fluid cooled channeled heat exchange device 600. Although not shown, the channels in the base plate of the device 600 are configured in a radial geometry as in FIG. 6.

Specifically, cool air flows in the direction into or out of the page of the drawing of FIG. 6. A fan (not shown) takes in cool air and blows the cool air onto the plurality of fins 603. The plurality of fins 603 are coupled to a flat plate heat exchanger 604. The flat plate heat exchanger 604 comprises a plurality of channels contained within a coupled base plate and top plate channel section 605. The channel section 605 is configured to permit flow of fluid therethrough as described in detail above. The plurality of fins 603 shown in FIG. 6 and the components of the device 600 are also described in detail above.

Figure 7A:
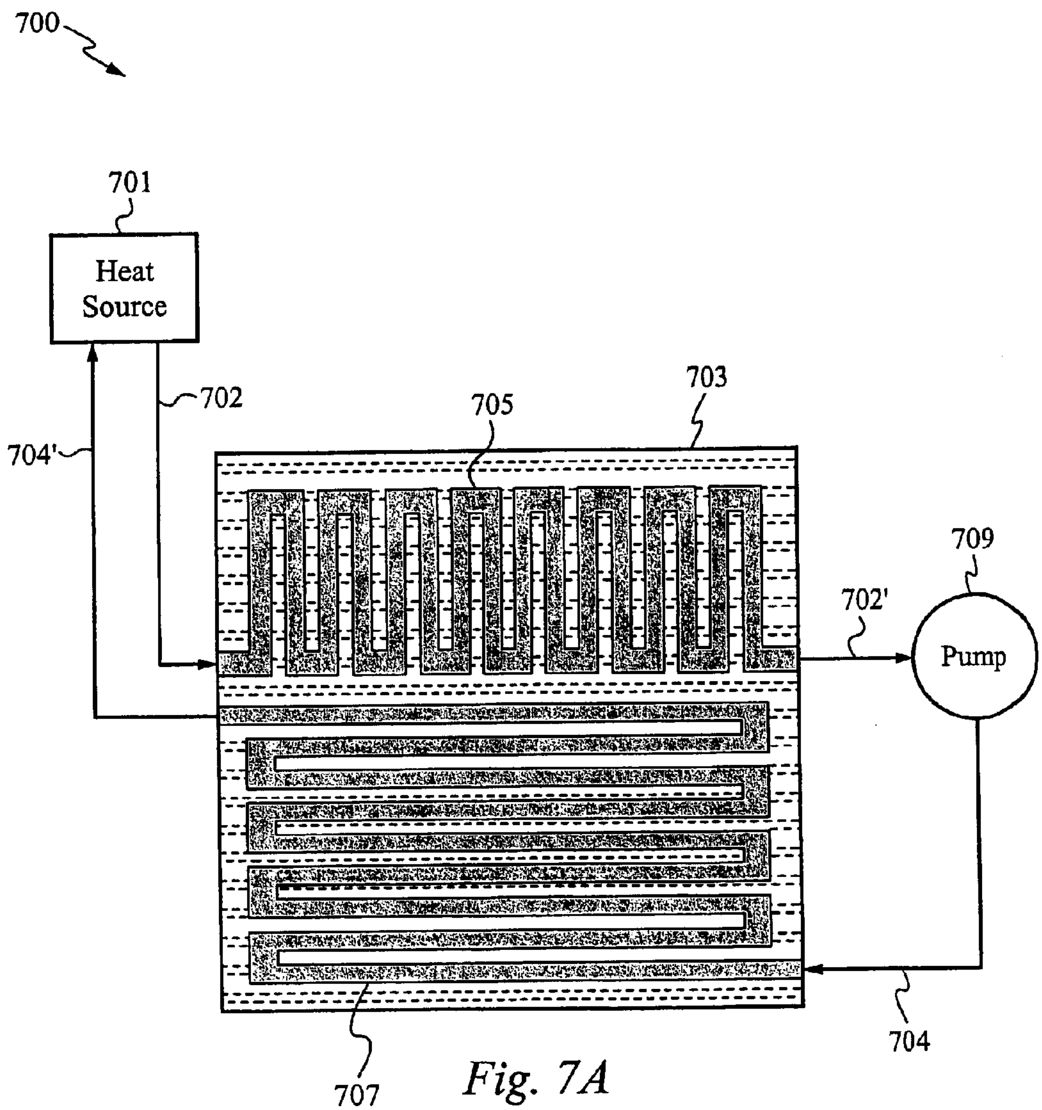
FIG. 7A illustrates the top view of a system for fluid cooled channeled flat plate fin heat exchange configured for fluid cooling through separate fluid paths, in accordance with the instant invention.

FIG. 7A illustrates the top view of a system 700 comprising a heat source 701, a fluid cooled channeled flat plate fin heat exchange device 703, and a pump 709. The device 703 comprises at least two fluid paths configured to permit flow of a liquid therethrough. In the embodiment illustrated in FIG. 7A, two fluid paths are shown: the first path 705 and the second path 707. The first path 705 and the second path 707 are preferably separate and distinct. It should be understood that the device 703 is similar to the one described in the discussion of FIG. 2A with the exception that the device 703 comprises at least two paths that are separate and distinct. It should also be understood that in alternate embodiments, the device 703 is similar to the one described in the discussion of FIG. 2B with the exception that the device 703 comprises at least two paths that are separate and distinct in addition to the gaps shown in FIG. 2B.

The device 703 is preferably configured to cool a fluid in a heated state to a cooler state. The pump 709 is configured to circulate the fluid in the heated state and the cooler state to and from the device 703. Further, the heat source 701 preferably comprise a microprocessor.

In operation, the path 702 couples the heat source 701 to the device 703. It should be understood that the first path 705 and the second path 707 of the device 703 are contained within the device 703 and are not to be confused with the paths 702, 702', 704, and 704'. The path 702 is configured to carry the fluid in the heated state from the heat source 701 to first path 705 of the device 703. The fluid in the heated state from the heat source 701 is circulated through the first path 705 and cooled. Following the circulation and cooling, the fluid is in a cooler state and exits the device 703 via the path 702'. The path 702' couples the device 703 to the pump 709 and is configured to carry the fluid in a cooler state from the device 703 to the pump 709. The path 704 couples the pump to the device 703. The path 704 is configured to carry the fluid in a cooler state from the pump 709 to the second path 707 of the device 703. The second path 707 is preferably separate and distinct from the path 705 and is not coupled to the paths 702 and 702'. The fluid in a cooler state from the pump 709 is circulated through the second path 707 and cooled by the device 703. Following the circulation and cooling, the fluid is in a cooler state and exits the device 703 via the path 704'. The path 704' couples the device 703 to the heat source 701 and is configured to carry the fluid in a cooler state from the device 703 to the heat source 701, thereby cooling the heat source 701.

Figure 7B:
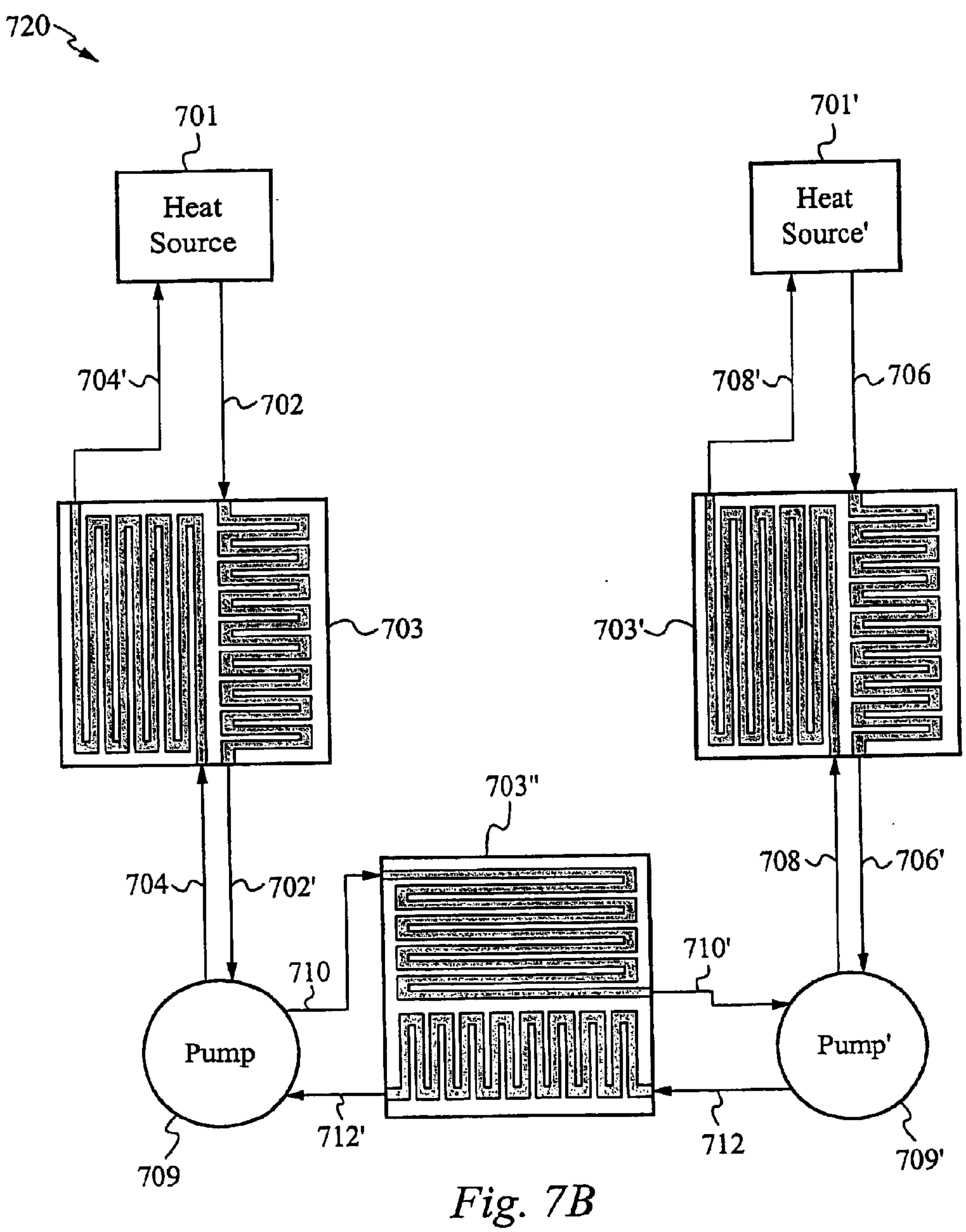
FIG. 7B illustrates the top view of a fluid cooled channeled flat plate fin heat exchange system, comprising a plurality of fluid channel heat exchange devices and a plurality of pumps for cooling a plurality of heat sources, in accordance with the instant invention.

FIG. 7B illustrates a heat exchange system 720. The system 720 comprises a plurality of heat sources 701, 701' and 701", a plurality of fluid channel heat exchange devices 703, 703' and 703", and a plurality of pumps 709 and 709'. It should be understood that the plurality of heat sources 701, 701' and 701", the plurality of fluid channel heat exchange devices 703, 703' and 703", and the plurality of pumps 709 and 709' are merely representations of a plurality. Further, it should be understood that the configuration of the various components illustrated is merely a representation of a system and various configurations with different coupling of the components are alternate embodiments of the system. For example, in one embodiment, the various components illustrated are configured such that multiple heat sources (chips, for example) heat the fluid, and each send the heated fluid through a separate fluid channel heat exchange device. Or, in another configuration, multiple pumps, or combinations or pumps and heat sources, each send the heated fluid through a separate fluid channel heat exchange device.

The plurality of fluid channel heat exchange devices 703, 703' and 703" are configured to cool a fluid in a heated state to a cooler state. Each device 703, 703' and 703" comprises at least two fluid paths configured to permit flow of a liquid therethrough, as detailed in FIG. 7A above. The plurality of pumps 709 and 709' are configured to circulate the fluid in the heated state and the cooler state to and from the plurality of fluid channel heat exchange devices 703, 703' and 703" and to and from the plurality of pumps 709 and 709'. Further, the plurality of heat sources 701, 701' and 701" preferably comprise one or more microprocessors and one or more pumps.

The at least two fluid paths of the plurality of fluid channel heat exchange devices 703, 703' and 703" are preferably separated and are configured to carry the fluid in the heated state from the plurality of heat sources 701, 701' and 701". In addition, the at least two fluid paths of the plurality of fluid channel heat exchange devices 703, 703' and 703" are configured to carry the fluid in the cooler state to the plurality of heat sources 701, 701' and 701".

For example, the path 702 couples the heat source 701 to the device 703. It should be understood that the least two fluid paths of the plurality of fluid channel heat exchange devices 703, 703' and 703" are contained within the devices 703, 703', and 703" and are not to be confused with the paths 702, 702', 704, 704', 706, 706', 708, 708', 710, 710', 712, and 712'. The path 702 is configured to carry the fluid in the heated state from the heat source 701 to one of the fluid paths of the device 703. The fluid in the heated state from the heat source 701 is circulated through and cooled by the device 703. Following the circulation and cooling, the fluid is in a cooler state and exits the device 703 via the path 702'. The path 702' couples the device 703 to the pump 709 and is configured to carry the fluid in a cooler state from the device 703 to the pump 709. The path 704 couples the pump to the device 703. The path 704 is configured to carry the fluid in a cooler state from the pump 709 to a separate fluid path of the device 703 that is not coupled to the paths 702 and 702'. The fluid in a cooler state from the pump 709 is circulated through and cooled by the device 703. Following the circulation and cooling, the fluid is in a cooler state and exits the device 703 via the path 704'. The path 704' couples the device 703 to the heat source 701 and is configured to carry the fluid in a cooler state from the device 703 to the heat source 701, thereby cooling the heat source 701.

Similarly, the path 706 couples the heat source 701' to the device 703'. The path 706 is configured to carry the fluid in the heated state from the heat source 701' to one of the fluid paths of the device 703'. The fluid in the heated state from the heat source 701' is circulated through and cooled by the device 703'. Following the circulation and cooling, the fluid is in a cooler state and exits the device 703' via the path 706'. The path 706' couples the device 703' to the pump 709' and is configured to carry the fluid in a cooler state from the device 703' to the pump 709'. The path 708 couples the pump 709' to the device 703'. The path 708 is configured to carry the fluid in a cooler state from the pump 709' to a separate fluid path of the device 703' that is not coupled to the paths 706 and 706'. The fluid in a cooler state from the pump 709' is circulated through and cooled by the device 703'. Following the circulation and cooling, the fluid is in a cooler state and exits the device 703' via the path 708'. The path 708' couples the device 703' to the heat source 701' and is configured to carry the fluid in a cooler state from the device 703' to the heat source 701', thereby cooling the heat source 701'.

In the embodiment shown in FIG. 7B, the device 703" is coupled to the pump 709 and the pump 709" and serves to cool the extra heat imparted to the fluid by the pumps. Specifically, the path 710 couples the pump 709 to the device 703". The path 710 is configured to carry the fluid in the heated state from the pump 709 to one of the fluid paths of the device 703". The fluid in the heated state from the pump 709 is circulated through and cooled by the device 703". Following the circulation and cooling, the fluid is in a cooler state and exits the device 703" via the path 710'. The path 710' couples the device 703" to the pump 709' and is configured to carry the fluid in a cooler state from the device 703" to the pump 709'. The path 712 couples the pump 709' to the device 703". The path 712 is configured to carry the fluid in a cooler state from the pump 709' to a separate fluid path of the device 703" that is not coupled to the paths 710 and 710'. The fluid in a cooler state from the pump 709' is circulated through and cooled by the device 703". Following the circulation and cooling, the fluid is in a cooler state and exits the device 703" via the path 712'. The path 712' couples the device 703" to the pump 709 and is configured to carry the fluid in a cooler state from the device 703" to the pump 709, thereby cooling the pump 709.

In addition to the embodiments disclosed above, various methods for manufacturing a channeled flat plat heat exchange device is also disclosed. First, a method for manufacturing a soldered fin flat plate heat exchanger is disclosed. This method comprising machining fluid channels into each of two plate halves. Fins are soldered onto each of the two plate halves next. The fluid channels are then nickle or copper plated. Finally, the two halves are coupled such that the fluid channels of each of the two plate halves mate and form a leakproof fluid path.

Figure 8:
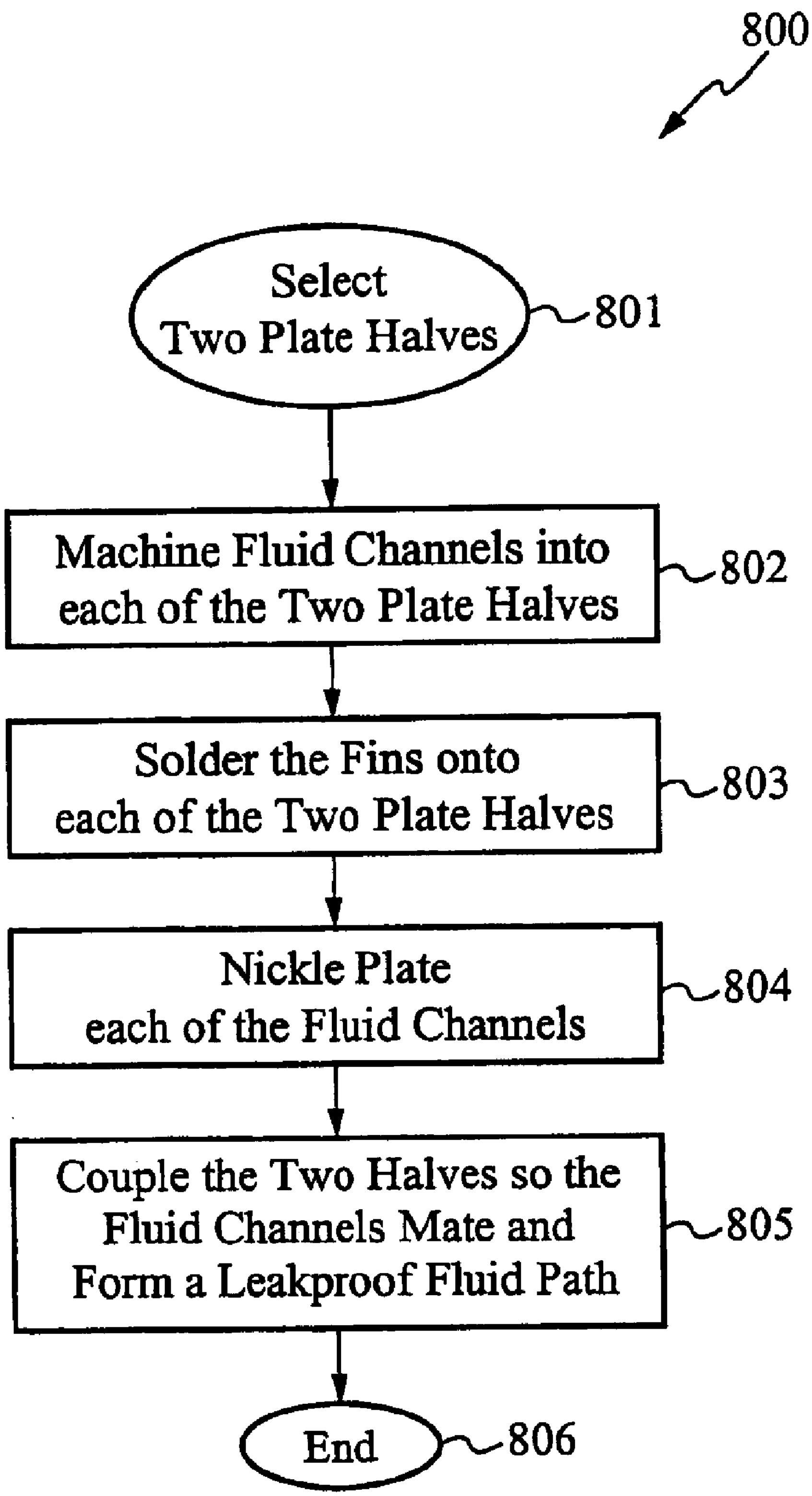
FIG. 8 illustrates an exemplary flow chart detailing a method for manufacturing a channeled flat plat heat exchange device, in accordance with the instant invention.

Specifically, FIG. 8 illustrates an exemplary flow chart 800 detailing a method for manufacturing a channeled flat plat heat exchange device, in accordance with the instant invention. At the step 801, two plate halves are selected. At the step 802, fluid channels are machined into each of two plate halves. At the step 803, fins are soldered onto each of the two plate halves. Following the step 803, at the step 804, fluid channels are nickle or copper plated. At the step 805, the two halves are coupled such that the fluid channels of each of the two plate halves mate and form a leakproof fluid path. The method for manufacturing a channeled flat plat heat exchange device ends at the step 806.

The two halves are preferably coupled by a soldering method. The soldering method comprises utilizing a solder paste applied by stencil screen printing onto each of the two plate halves to form a bonding interface resulting in a hermetic seal. This ensures a consistent and uniform application of solder, resulting in a hermetic seal of the two halves. Further, in other embodiments, the soldering method comprises a step soldering process for multiple soldering operations. In the alternate embodiments, various allots of solder paste are used. For example, it may be necessary to solder the two halves at a higher temperature followed by a tube attachment soldering step at a lower temperature.

An alternate method for manufacturing involves the manufacture of an extruded fin flat plate heat exchanger. This method first comprises manufacturing a first finned extrusion. A second fined extrusion is next fabricated. Complementary fluid channels are machined onto the first and second finned extrusions. Finally, the first finned extrusion is coupled to the second fined extrusion such that the fluid channels of the first and second finned extrusions mate and form a leakproof fluid path. The method of coupling the first finned extrusion to the second finned extrusion may be either a soldering method or an epoxy method (both described above).

Finally, a method for manufacturing a skived fin flat plate heat exchanger is disclosed. This method comprises manufacturing a first finned halve by a skiving method followed by manufacturing a second finned halve by a skiving method. Next, complementary fluid channels are machined onto the first and second finned halves. Finally, the first finned halve is coupled to the second fined halve such that the fluid channels of the first and second finned halves mate and form a leakproof fluid path. The method of coupling the first finned halve to the second finned halve may be either a soldering method or an epoxy method (both described above).

The current invention provides a more efficient and effective cooling system that offers substantial benefits in heat flux removal capability compared with conventional cooling devices. The fluid cooled invention disclosed dissipates heat while also providing a significant reduction in the amount of surface area required due to a higher heat-transfer rate. In addition, the current invention dissipates more heat with considerably less flow volume and acoustic noise. Further, the current invention maintains substantial temperature uniformity at the X-Y direction in addition to dissipating heat to the ambient with low thermal resistance.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A device for fluid cooled channeled heat exchange comprising:

a. a flat plate heat exchanger, wherein the flat plate heat exchanger comprises a top plate and a base plate coupled together; and b. a plurality of fins coupled to the top plate;

wherein the base plate comprises:

i. fluid inlet configured to receive flow of a fluid in a heated state therethrough;

ii. a plurality of channels coupled to the fluid inlet and configured to receive and to cool the fluid;

iii. a first plurality of separate sealed gaps coupled in between the plurality of channels, wherein the separate sealed gaps are not traversed by the fluid; and iv. a fluid outlet coupled to the plurality of channels and configured to receive the cooled fluid and to allow the cooled fluid to exit the device.

2. The device of claim 1, wherein the device further comprises a second plurality of fins coupled to the base plate.

3. The device of claim 1, wherein the first plurality of separate sealed gaps are filled with a gas.

4. The device of claim 1, wherein the device further comprises a second plurality of separate sealed gaps coupled in between the fluid inlet and the plurality of channels, wherein the separate sealed gaps are not traversed by the fluid.

5. The device of claim 4, wherein the second plurality of separate sealed gaps are filled with a gas.

6. The device of claim 1, wherein the device further comprises a third plurality of separate sealed gaps coupled in between the fluid outlet and the plurality of channels, wherein the separate sealed gaps are not traversed by the fluid.

7. The device of claim 6, wherein the third plurality of separate sealed gaps are filled with a gas.

8. The device of claim 1, wherein the device is coupled to heat source.

9. The device of claim 8, wherein the heat source is a microprocessor.

10. The device of claim 1, wherein the device is coupled to a pump.

11. The device of claim 1, wherein the plurality of channels comprise condensers configured to condense the fluid.

12. The device of claim 1, wherein the plurality of channels further comprise pins, wherein the pins protrude from and are perpendicular to the surface of the base plate.

13. The device of claim 1, wherein the fluid inlet, the plurality of channels, and the fluid outlet are in a radial configuration.

14. The device of claim 1, wherein the fluid inlet, the plurality of channels, and the fluid outlet are in a spiral configuration.

15. The device of claim 1, wherein the fluid inlet, the plurality of channels, and the fluid outlet are in an angular configuration.

16. The device of claim 1, wherein the fluid inlet, the plurality of channels, and the fluid outlet are in a parallel configuration.

17. The device of claim 1, wherein the fluid inlet, the plurality of channels, and the fluid outlet are in a serpentine configuration.

18. The device of claim 1, wherein the device is in a monolithic configuration.

19. The device of claim 1, wherein the device further comprises a conductive fluid proof barrier, wherein the barrier is interposed between the base plate and the top plate.

20. The device of claim 1, wherein the plurality of fins are coupled with the top plate and the second plurality of fins are coupled with the base plate by a eutectic bonding method.

21. The device of claim 1, wherein the plurality of fins are coupled with the top plate and the second plurality of fins are coupled with the base plate by an adhesive bonding method.

22. The device of claim 1, wherein the plurality of fins are coupled with the top plate and the second plurality of fins are coupled with the base plate by a brazing method.

23. The device of claim 1, wherein the plurality of fins are coupled with the top plate and the second plurality of fins are coupled with the base plate by a welding method.

24. The device of claim 1, wherein the plurality of fins are coupled with the top plate and the second plurality of fins are coupled with the base plate by a soldering method.

25. The device of claim 1, wherein the plurality of fins are coupled with the top plate and the second plurality of fins are coupled with the base plate by an epoxy.

26. The device of claim 1, wherein the flat plate heat exchanger comprises a material with a thermal conductivity value larger than 150 W/m-K.

27. The device of claim 1, wherein the flat plate heat exchanger comprises copper.

28. The device of claim 1, wherein the flat plate heat exchanger comprises aluminum.

29. The device of claim 1, wherein the fluid outlet and the plurality of channels comprise precision machined metals.

30. The device of claim 1, wherein the fluid outlet and the plurality of channels comprise precision machined alloys.

31. The device of claim 1, wherein the plurality of fins comprise aluminum.

32. The device of claim 1, wherein the fluid is selected from one of a liquid and a combination of a liquid and a vapor.

33. The device of claim 1, wherein the fluid is comprised from the group comprising of water, ethylene glycol, isopropyl alcohol, ethanol, methanol, and hydrogen peroxide.

34. A device for two phase fluid cooled channeled heat exchange comprising:

a. a flat plate heat exchanger, wherein the flat plate heat exchanger comprises a top plate and a base plate coupled together, and the base plate comprises:
   i. a single phase region comprising a plurality of two phase channels configured to permit flow of a fluid therethrough, along a first axis;
   ii. a condensation region comprising a plurality of condenser channels coupled to the plurality of two phase channels, and configured to permit flow of the fluid therethrough, along a second axis not parallel to the first axis; and b. a first plurality of fins coupled to the top plate of the flat plate heat exchanger.

35. The device of claim 34, wherein the device further comprises a plurality of separate sealed gaps coupled in between the single phase region and the condensation region, wherein the separate sealed gaps are filled with a gas.

36. The device of claim 34, wherein the device further comprises a second single phase region comprising a plurality of single phase channels coupled to the plurality of condenser channels and configured to permit flow of a fluid therethrough, along the first axis.

37. The device of claim 34, wherein the plurality of two phase channels and the plurality of condenser channels are in a serpentine configuration.

38. The device of claim 34, wherein the device further comprises a second plurality of fins coupled to the base plate of the flat plate heat exchanger.

39. The device of claim 34, the device is coupled to a heat source.

40. The device of claim 39, wherein the heat source is a microprocessor.

41. The device of claim 34, wherein the fluid is selected from one of a liquid and a combination of a liquid and a vapor.

42. The device of claim 34, wherein the fluid is comprised from the group comprising of water, ethylene glycol, isopropyl alcohol, ethanol, methanol, and hydrogen peroxide.

43. The device of claim 34, wherein the fluid comprises water.

44. The device of claim 34, wherein the flat plate heat exchanger comprises copper.

45. The device of claim 34, wherein the plurality of fins comprise aluminum.

46. A system for heat exchange comprising:

a. one or more fluid channel heat exchangers each comprising at least two separate fluid paths configured to permit flow of a fluid therethrough and including:
   i. a plurality of non-uniform fluid channels configured to permit flow of the fluid therethrough; and,
   ii. a plurality of separate sealed gaps coupled in between the plurality of non-uniform channels and configured not to permit flow of the fluid therethrough; and, b. one or more pumps configured to circulate the fluid to and from the one or more fluid channel heat exchangers.

47. The system for heat exchange of claim 46, wherein the system further comprises a plurality of heat sources.

48. The system for heat exchange of claim 47, wherein the plurality of heat sources comprise one or more microprocessors.

49. The system for heat exchange of claim 47, wherein the plurality of heat sources comprise the one or more pumps.

50. The system for heat exchange of claim 46, wherein the one or more fluid channel heat exchangers are further configured to cool a fluid in a heated state to a cooled state.

51. The system for heat exchange of claim 50, wherein the at least two fluid paths are configured to carry the fluid in the heated state from the plurality of heat sources and to carry the fluid in the cooled state to the plurality of heat sources.

52. The system of claim 46, wherein the at least two separate fluid paths are parallel.

53. The system of claim 46, wherein the at least two separate fluid paths are in a serpentine configuration.

54. The system of claim 46, wherein the fluid is selected from one of a liquid and a combination of a liquid and a vapor.

55. A method of manufacturing a flat plate heat exchanger comprising:

a. machining fluid channels into each of two plate halves;

b. soldering fins onto each of the two plate halves;

c. nickle plating the fluid channels; and d. coupling the two halves such that the fluid channels of each of the two plate halves mate and form a leakproof fluid path.

56. The method of claim 55, wherein the two halves are coupled by a soldering method.

57. The method of claim 56, wherein the soldering method comprises utilizing a solder paste applied by stencil screen printing onto each of the two plate halves to form a bonding interface resulting in a hermetic seal.

58. The method of claim 56, wherein the soldering method comprises a step soldering process for multiple soldering operations.

59. The method of claim 55, wherein the two halves are coupled by an epoxy.

60. A method for manufacturing a flat plate heat exchanger comprising:

a. manufacturing a first finned extrusion;

b. manufacturing a second finned extrusion;

c. machining complementary fluid channels onto the first and second finned extrusions; and d. coupling the first finned extrusion to the second finned extrusion by a method from a group consisting of eutectic bonding, adhesive bonding, brazing, welding, soldering, and epoxy such that the fluid channels of the first and second finned extrusions mate and form a leakproof fluid path.

61. The method of claim 60, wherein the first finned extrusion is coupled to the second finned extrusion by a soldering method.

62. The method of claim 61, wherein the soldering method comprises utilizing a solder paste applied by stencil screen printing onto each of the first and second finned extrusions to form a bonding interface resulting in a hermetic seal.

63. The method of claim 61, wherein the soldering method comprises a step soldering process for multiple soldering operations.

64. The method of claim 60, wherein the first finned extrusion is coupled to the second finned extrusion by an epoxy.

65. A method for manufacturing a flat plate heat exchanger comprising:

a. manufacturing a first finned halve by a skiving method;

b. manufacturing a second finned halve by a skiving method;

c. machining complementary fluid channels onto the first and second finned halves; and d. coupling the first finned halve to the second fined halve such that the fluid channels of the first and second finned halves mate and form a leakproof fluid path.

66. The method of claim 65, wherein the two finned halves are coupled by a soldering method.

67. The method of claim 66, wherein the soldering method comprises utilizing a solder paste applied by stencil screen printing onto each of the first and second finned halves to form a bonding interface resulting in a hermetic seal.

68. The method of claim 66, wherein the soldering method comprises a step soldering process for multiple soldering operations.

69. The method of claim 65, wherein the two finned halves are coupled by an epoxy.

70. A device for fluid cooled channeled heat exchange comprising:

a. a flat plate heat exchanger, wherein the fiat plate heat exchanger comprises a top plate and a base plate coupled together;

b. a first plurality of fins coupled to the top plate; and c. a second plurality of fins coupled to the base plate;

wherein the base plate comprises:

i. fluid inlet configured to receive flow of a fluid in a heated state therethrough;

ii. a plurality of non-uniform channels coupled to the fluid inlet and configured to receive and to cool the fluid; and iii. a fluid outlet coupled to the plurality of channels and configured to receive the cooled fluid and to allow the cooled fluid to exit the device;

wherein the first plurality of fins are coupled to the top plate and the second plurality of fins are coupled to the base plate by a method from a group consisting of eutectic bonding, adhesive bonding, brazing, welding, soldering, and epoxy.

* * * * *